United States Patent
Kozlowski

(12) 
(10) Patent No.: US 6,417,504 B1
(45) Date of Patent: Jul. 9, 2002

(54) COMPACT ULTRA-LOW NOISE HIGH-BANDWIDTH PIXEL AMPLIFIER FOR SINGLE-PHOTON READOUT OF PHOTODETECTORS

(75) Inventor: Lester J. Kozlowski, Simi Valley, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 94 days.

(21) Appl. No.: 09/675,735

(22) Filed: Sep. 29, 2000

(51) Int. Cl.[7] .............................. H01J 40/14
(52) U.S. Cl. .................. 250/214 R; 250/208.1
(58) Field of Search .................. 250/214 R, 214 A, 250/214 LA, 214 LS, 208.1; 348/300, 301, 308, 322, 320; 257/290, 291

(56) References Cited

U.S. PATENT DOCUMENTS

| | | | |
|---|---|---|---|
| 5,929,434 A | | 7/1999 | Kozlowski et al. ..... 250/214 A |
| 6,067,113 A | * | 5/2000 | Hurwitz et al. ............. 348/241 |
| 6,069,376 A | | 5/2000 | Merrill ........................ 257/291 |

OTHER PUBLICATIONS

Chamberlain et al, "A Novel Wide Dynamic Range Silicon Photodetector and Linear Imaging Array" IEEE Transactions on Electron Devices, vol. ED–31, No. 2, Feb. 1984 pp. 175–182.

SPIE The International Society for Optical Engineering, *Infrared Readout Electronics III,* 1996, vol. 2745, pp. 41–49 (Month unknown).

* cited by examiner

*Primary Examiner*—Que T. Le
(74) *Attorney, Agent, or Firm*—Koppel, Jacobs, Patrick & Heybl

(57) ABSTRACT

An ultra-low noise, high gain interface pixel amplifier is provided with capability for single-photon readout of known photodetectors at high electrical bandwidths for diverse spectral bandpass from the x-ray to long IR bands. The detector charge modulates a source follower whose output is double sampled to remove correlated noise by a compact stage that also provides optimum level shift for subsequent amplification of the full signal excursion. The level-shifted signal finally drives a compact amplifier that generates a robust end-to-end transimpedance. Single-photon readout of photodetectors at high electrical bandwidths in small pixel areas is thereby facilitated.

8 Claims, 5 Drawing Sheets

COMPACT ULTRA-LOW NOISE HIGH-BANDWIDTH PIXEL AMPLIFIER FOR SINGLE-PHOTON READOUT OF PHOTODETECTORS

BACKGROUND OF THE INVENTION

1. Field of the Invention

This invention relates to photon detection in general, and more particularly to amplifiers for single photon readout of semiconductor photodetectors in pixellated imaging arrays.

2. Description of the Related Art

Optical sensors transform incident radiant signals in the X-ray ($\lambda$<0.001 $\mu$m), ultraviolet ($\lambda$=0.001–0.4 $\mu$m), visible ($\lambda$=0.4–0.8 $\mu$m), near infrared (IR) ($\lambda$=0.8–2 $\mu$m), shortwave IR ($\lambda$=2.0–2.5 $\mu$m), mid IR ($\lambda$=2.5–5 $\mu$m), and long IR ($\lambda$=5–20 $\mu$m) bands into electrical signals that are used for data collection, processing, storage and display such as real-time video. Available conventional photodetectors such as photodiodes and photoconductors are inexpensive, exhibit bandwidths that support current video frame rates, are sensitive to wavelengths well into the long IR band, and exhibit a high degree of uniformity from pixel to pixel when used in an imaging array. However, these photodetectors have no gain, i.e. each incident photon generates, at most, a single electron; these imaging systems thus work very well only in moderate to bright light conditions. They provide electrical signals at low light levels that are too small to be read-out by conventional readout circuits.

In conditions of low ambient light, the standard photodetector is often replaced with an avalanche photodiode that provides gain such that conventional readout circuits, such as charge coupled devices, i.e. CCDs, can read out the data at video frame rates with a high signal-to-noise ratio (SNR). The fabrication of avalanche photodiodes is much more difficult and expensive than standard photodetectors because they must exhibit very high controlled gain and very low noise. Furthermore, currently available avalanche photodiodes exhibit relatively poor uniformity, are constrained to shorter wavelengths than standard photodetectors (0.7 $\mu$m), and have limited sensitivity due to their relatively low quantum efficiency. Imaging intensified systems use an array of avalanche photodiodes or microchannel plates to drive respective display elements such as CCDs or phosphors, and have even lower wavelength capabilities (approximately 0.6 $\mu$m max) due to the limitations of the photodiode.

Chamberlain et al. "A Novel Wide Dynamic Range Silicon photodetector and Linear Imaging Array" IEEE Transactions on Electron Devices, Vol. ED-31, No. 2, February 1984, pp. 175–182 describes a gate modulation technique for single photon readout of standard photodetectors. Chamberlain provides a high gain current mirror that includes a load FET whose gate is connected to its drain to ensure subthreshold operation and to eliminate threshold voltage ($V_T$) non-uniformity. The pixel-to-pixel $V_T$ non-uniformity associated with standard silicon CMOS fabrication processes would otherwise substantially degrade the performance of the imaging array. The signal from the photodetector is injected into the load FET thereby producing a signal voltage at the gate of a gain FET. This signal modulates the gain FET's gate voltage, thereby storing integrated charge in a storage capacitor that is read out and reset via a pair of FET switches.

Although Chamberlain's particular gain modulation technique provides a large dynamic range and is useful for detecting signals across a broad spectral range, the current mirror's bandwidth severely restricts the imaging array's bandwidth. Specifically, the dominant RC time constant is the parallel combination of the photodetector's capacitance and the resistance of the load FET. In subthreshold operation, the FET's transconductance is very low and, hence, its load resistance is very large, at >$10^{14}$ ohms; the minimum resulting RC time constant is on the order of seconds. Thus, Chamberlain's gate modulation technique is only practically useful for imaging daylight scenes or static low-light-level scenes such as stars. Furthermore, to achieve large current gain, the load FET is typically quite small. As a result, the load FET exhibits substantial 1/f noise, which under low light conditions seriously degrades the performance of the imaging array.

Kozlowski et al. "SWIR staring FPA Performance at Room Temperature," SPIE Vol. 2746, pp. 93–100, April 1996 describes a phenomenon called "night glow" in the short wavelength infrared (SWIR) band that enables detection on very dark nights where photon flux is on the order of one hundred photons per imaging frame. Kozlowski details InGaAs and HgCdTe detector arrays for use with two different readout circuits. Both use current mirrors similar to Chamberlain, but one also buffers the detector node to maintain constant detector bias. Unlike SWIR band and longer wavelength detector arrays, near IR and visible detectors are not sensitive to changes in detector bias, and thus buffering to maintain constant bias is irrelevant. More importantly, the buffering enhances the circuit bandwidth such that the bandwidth is significantly enhanced; yet the bandwidth is still insufficient for displaying video at very high frame rates. The negative feedback amplifier A1, in U.S. Pat. No. 5,929,434, reduces the input impedance of the high-gain circuit and thereby enhances its bandwidth. In the case where the buffer amplifier is approximated to have infinite voltage gain and finite transconductance, the dominant pole is given by:

$$\tau_{B-L} = \frac{C_f}{g_{m_{Q1}}}$$

where $C_f$ is the effective feedback capacitance of the buffer amplifier from its output to its input. Assuming a cascoded amplifier configuration, the gate-source capacitance of Q1 is dominant and $C_f$ is set by the gate-to-source capacitance of the subthreshold FET Q1. This is approximately given by the parasitic metal overlap capacitance. Assuming a minimum width transistor in 0.25 $\mu$m CMOS technology, for example, the minimum $C_f$ will be about 0.1 fF. Though this facilitates single photon sensing at video frame rates, additional boost is needed to support imaging at high frame rates well above 30 to 60 Hz.

Merrill finally teaches in U.S. Pat. No. 6,069,376 a pixel amplifier (FIG. 6) with speed switch suitable for still camera applications. This apparatus provides high-bandwidth signal integration with downstream gain, but its sensitivity is limited by the generation of reset noise at the storage element. Furthermore, a method is not provided for maximizing the signal's dynamic range at the input to the amplifier.

SUMMARY OF THE INVENTION

The invention is a photodetector readout circuit, with extremely high sensitivity, capable of single-photon detection. A photodetector (preferably a photodiode) integrates a small-signal photocharge on the detector capacitance in response to incident photons, producing a photodetector output signal. A buffer amplifier is arranged to receive the photodetector output signal and to produce a buffered photodetector output signal. A coupling capacitor, has a first terminal connected to the buffered output signal and a second terminal connected to a signal input of a signal amplifier. The coupling capacitor shifts signal level at the input to the signal amplifier by an offset voltage. An electronic offset reset switch, connected to the coupling capacitor, allows resetting of the offset voltage, preferably during a simultaneous reset of the photodiode. When sampling of the photodiode signal begins, the offset across the coupling capacitor is also clamped. This effects correlated double sampling of the photogenerated signal, and facilitates elimination of correlated noise generated by resetting (discharging) photodetector capacitance. An adjustment voltage is also preferably summed with signal at the input of the signal amplifier, to set the operating point of the signal amplifier above threshold and thereby improve transimpedance, dynamic range, and linearity.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a high bandwidth, ultra low-noise pixel amplifier that is capable of single photon readout of photodetectors in extremely low-light conditions, i.e. photon flux levels approaching zero photons per sampling period. This circuit can be used to effectively count incident photons on individual photodetectors, in an imaging array as the front-end to a conventional video system or in high frame-rate wavefront sensors. One of the primary benefits of the approach is that the circuit can use off-the-shelf photodetectors such as photodiodes or photoconductors that have gain <1 rather than, for example, avalanche multiplication within the photodiode. Such known photodetectors with gain <1 are cheaper, more uniform, easier to fabricate, more reliable, less susceptible to excess noise mechanisms within the detector, and support a much broader range of the electromagnetic spectrum than avalanche photodiodes.

Figure 1:
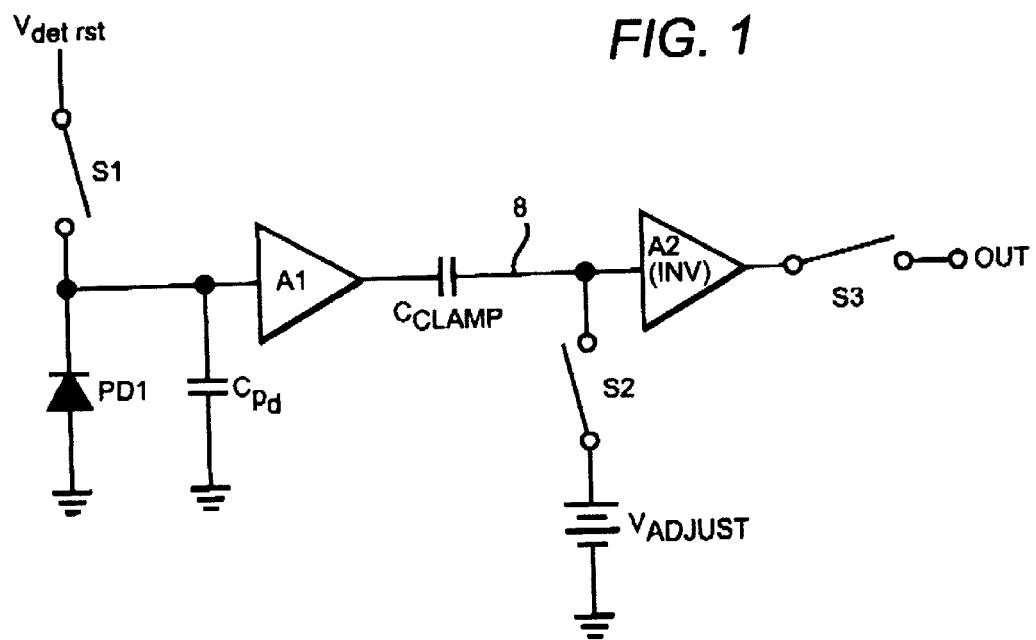
FIG. 1 is a schematic diagram of a generalized pixel amplifier in accordance with the invention.

The generalized circuit in accordance with the invention is shown in FIG. 1. Before photodetection begins, the circuit is initialized by closing switches S1 and S2. In this initial state, any Cpd (which represents the capacitance of photodiode PD1) is discharged (reset). Any offset voltage is amplified by amplifier A1, which is most suitably a unity gain buffer amplifier such as a source follower amplifier. Given sufficient reset time, the voltage across capacitor Cclamp will (VoA1–Vadjust) where VoA1 is the voltage at output of A1 in the presence of no signal input.

At some time both switches S1 and S2 are closed, setting the circuit in a sampling mode. Any photoelectric charge from PD1 will be integrated across Cpd. The voltage across Cpd provides an input the the buffer amplifier A1, and the amplified signal is coupled capacitively, through series capacitance Cclamp, to the input of a signal amplifier A2 (suitably an inverting amplifier, as discussed below). The voltage across Cclamp has been effectively clamped by the opening of switch s2. Thus, the voltage at the input of A2 will be (signal plus VoA1) minus (VoA1–Vadjust) or, more simply, signal +Vadjust. Vadjust is preferably set to fix the operating point of the signal amplifier, A2, in a range which is above threshold and chosen to yield large transimpedance, gain and dynamic range.

Figure 2:
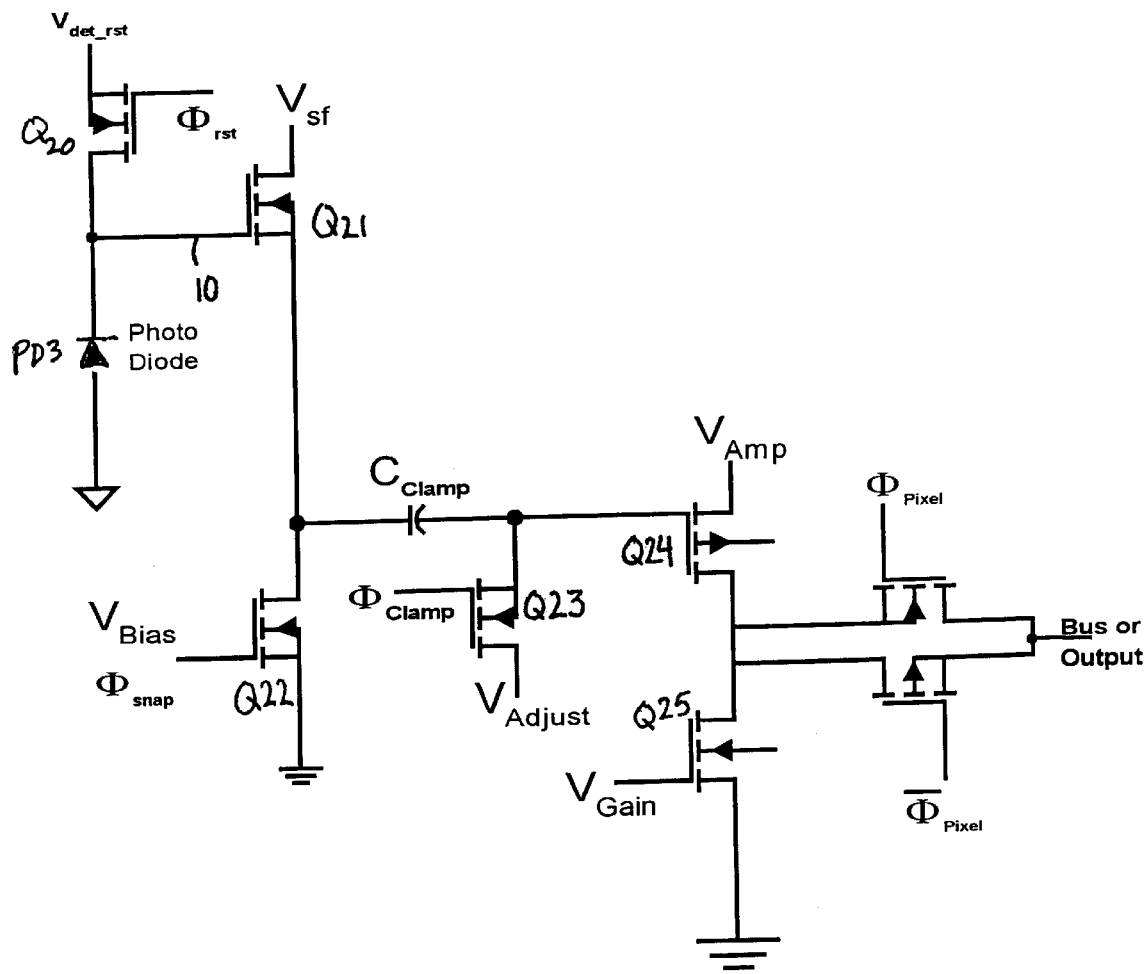
FIG. 2 is a schematic diagram for one embodiment of an ultra-low noise, high gain, high-bandwidth pixel amplifier suitable for single-photon readout of various photodetectors having detector capacitance of the order of 5 to 25 fF.

A specific embodiment is shown in FIG. 2 wherein a source follower amplifier converts the photocharge stored on the capacitance of photodetector diode PD3 to a significant voltage at a signal bandwidth limited by either the photodiode or the specific source follower design. Though the photodetector can also be a photoconductor of relatively high impedance, the generation rate for all carriers must be sufficiently low to not saturate the storage capacitance for the applicable integration time. When $\Phi_{rst}$ is high, Q20 sets the bias voltage across the photodetector diode PD3. The signal developed during the integration time across PD3's capacitance at node 10 is amplified and buffered by source follower FET Q21, which is current biased by Q22. The voltage $V_{bias}$ (at the gate of Q22) is preferably set to bias Q22 in the subthreshold region to minimize its luminance, which would otherwise increase noise and compromise the available dynamic range at long integration times.

Since the transimpedance established by the combined capacitance of the detector and amplifier transistor Q21 does not facilitate reading noise levels below about 10 e– at typical video rates, the invention preferably uses a level shifting stage in conjunction with a compact inverting amplifier stage. The inverting amplifier consisting of FETS Q24 and Q25 boosts the low-noise signal with voltage gain of several tens to several hundreds depending on the process used and the configuration of the inverter amplifier.

The output of the source follower FET Q21 is capacitively coupled by series capacitor $C_{clamp}$ initially, under control of a reset signal $\Phi_{CDS}$ applied to the gate of Q23 at the start of integration. After integration of the signal for the prescribed integration time, the integrated signal is sampled through the clamp capacitor to the gate of amplifier FET Q24. The clamping and sampling facilitated in this manner effects correlated double sampling of the photogenerated signal. This signal, which is essentially free of circuit-induced noise, subsequently drives the compact amplifier comprised of amplifier FET Q24 and bias FET Q25. The signal driving the amplifier FET Q24 is the difference between the photosignal plus offset voltage, minus the offset voltage initially stored on $C_{clamp}$ at the start of integration. The correlated noise generated by resetting the detector capacitance is thereby eliminated. By minimizing the capacitances of PD3 and the gate of FET Q21, the basic transimpedance can be maximized to first order to minimize the required size of the capacitor $C_{clamp}$. To facilitate sub-electron read noise, $C_{clamp}$ must, at a minimum, be at least 1 fF for operation at room temperature of 295K.

The clamping circuit comprised of $C_{clamp}$ and bias transistor Q23, also effects a compact method for setting the minimum signal level at a quiescent operating point compatible with exercising the full dynamic range of the compact amplifier comprised of transistors Q24 and Q25. The clamping circuit thus facilitates both correlated double sampling and dynamic range management.

Since the combined total capacitance of the photodetector and the gate of FET Q21 will practically be, at a minimum, >5 fF, the maximum photoconversion gain defined at the input to the compact amplifier is thus 32 $\mu$V/e–. Because the minimum read noise referred to the output needs to be on the order of 250 $\mu$V to 1 mV in practical video cameras, the ability to detect quanta requires that the compact amplifier provide a minimum voltage gain of from 10 to 30. This is facilitated in a compact manner via a CMOS inverter amplifier having minimum load transistor gate length in most submicron CMOS process technologies.

Figure 3:
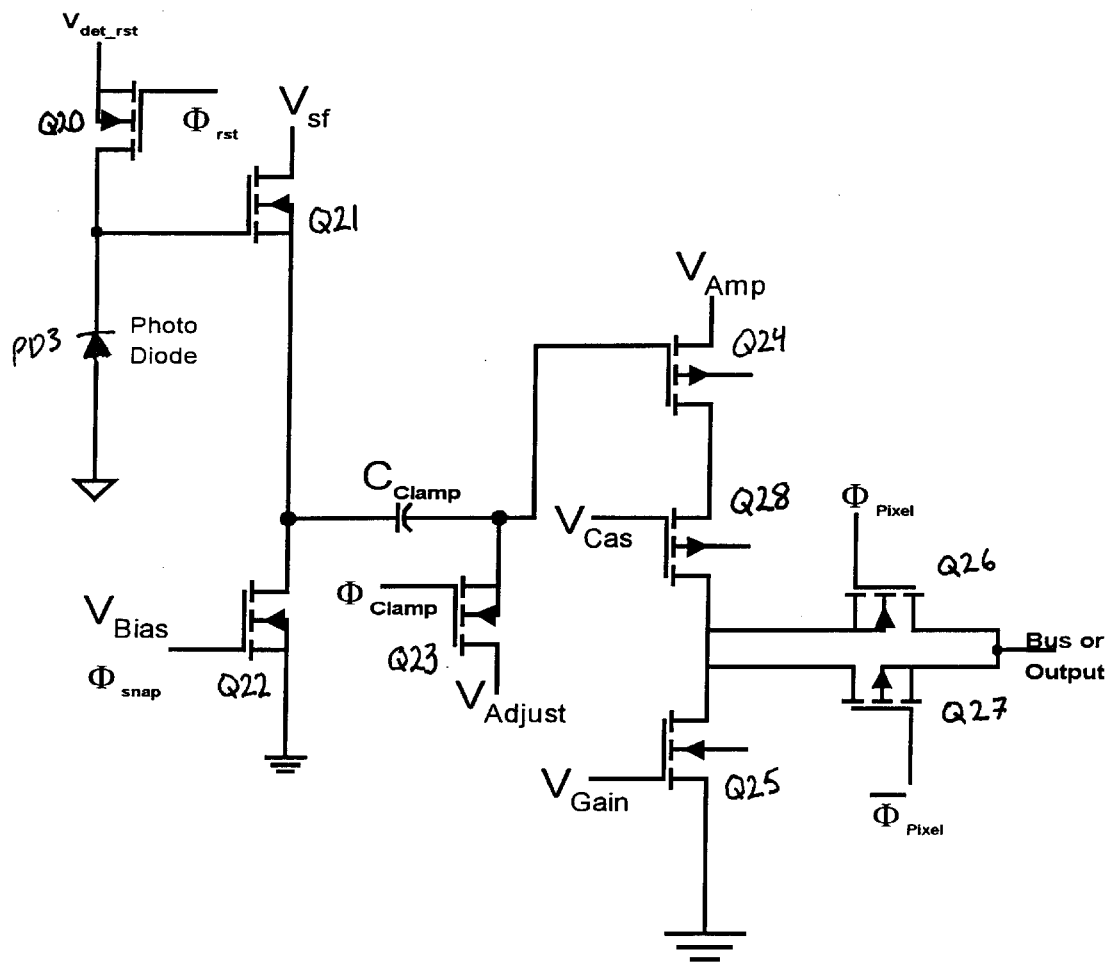
FIG. 3 is a schematic diagram for an alternate embodiment of an ultra-low noise, high gain, high-bandwidth pixel amplifier for single-photon readout of various photodetectors having detector capacitance of the order of 25 to 125 fF.

For some applications, on the other hand, the typical sense capacitance for useful detectors will often be as much as 100 fF. In this case, the compact amplifier needs to supply voltage amplification of up to 600. This is accomplished in the alternative embodiment of FIG. 3 by adding a cascode transistor Q28 to the inverter stage to boost the voltage gain. Once again the load FET has minimum gate length, e.g., typically from 0.25 to 0.32 $\mu$m for 0.25 $\mu$m CMOS technology, to uniformly minimize the amplifier's gain to a useful value.

The output of the low-noise pixel amplifier is read from the pixel by enabling $\Phi_{access}$ to supply the signal to the bus via the CMOS transmission switch comprising transistors Q26 and Q27. In many cases, the switch can be simplified to a transistor of one or the other polarity since the inverter amplifier does not swing from rail to rail. Furthermore, compression and extinction of high-level signals is effected by appropriately choosing a switch transistor of one appropriate polarity.

The pixel amplifier's output signal is then subsequently band-limited for the specific application via both the parasitic bus capacitance $C_L$ and by optionally adding capacitance external to the pixel, if necessary, to reduce the compact amplifier's wide-band thermal noise. This preferred amplifier, which is compatible with integration into pixels having pixel pitch smaller than 10 $\mu$m, is thus capable of detecting quanta with many types of detectors spanning a broad range in capacitance and spectral response.

The signal applied to transistor Q22 to supply bias current to the amplifier transistor Q21 can alternately be a duty-cycled clock, $\Phi_{snap}$, to facilitate the enabling and disabling of signal passthrough. This feature can be used to facilitate synchronous integration of the image across a two-dimensional imaging array. By thus applying a synchronous $\Phi_{rst}$ clock to the array to provide uniform reset time and appropriately applying a synchronous $\Phi_{snap}$ clock across the imaging sensor to first store the reset voltage across Cclamp and then sample the photovoltage onto the gate capacitance of all transistors Q24 in the mosaic, snapshot image formation is facilitated.

Figure 4:
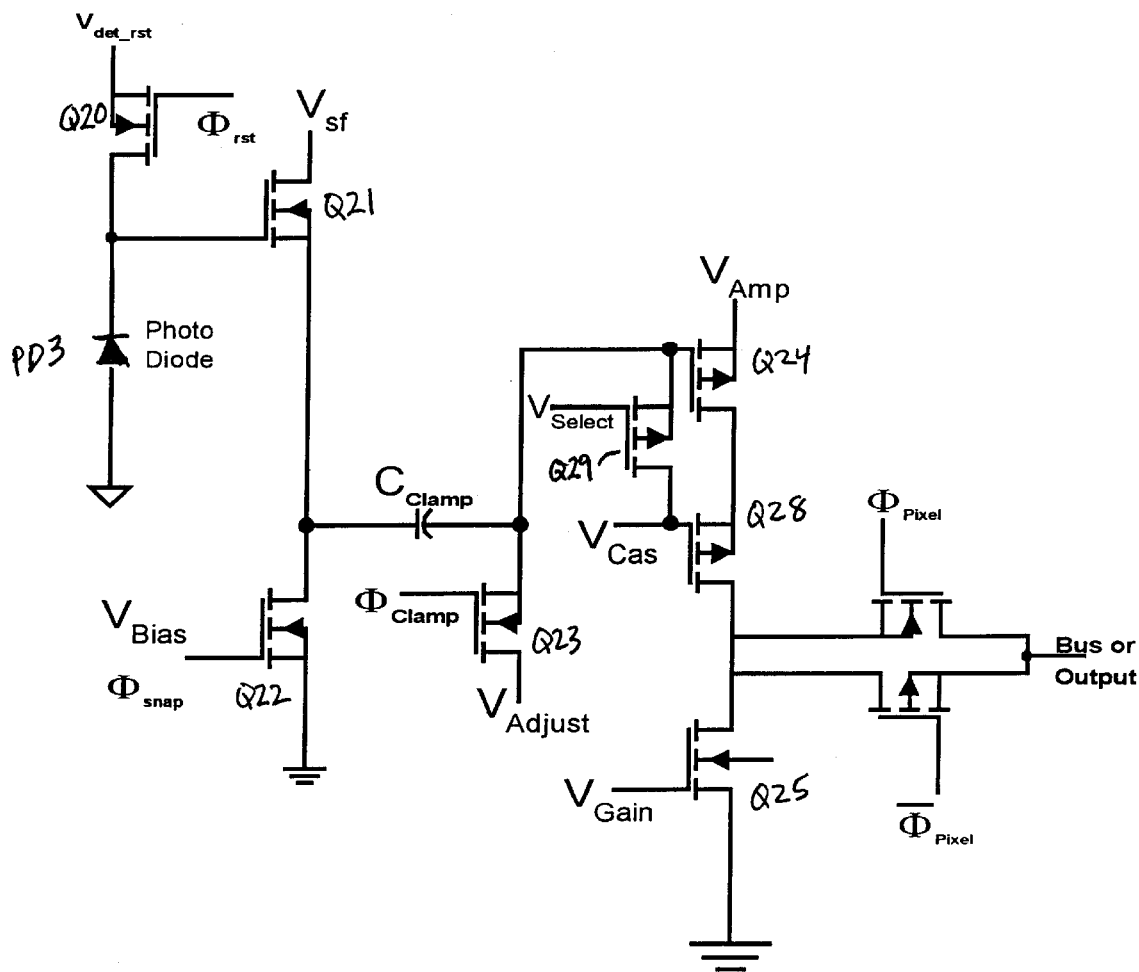
FIG. 4 is a schematic diagram for another alternate embodiment of an ultra-low noise, high gain, high-bandwidth pixel amplifier for single-photon readout of various photodetectors having large capacitance range.

FIG. 4 shows the schematic circuit for a second alternate embodiment wherein a broader range in capacitance is supported with the same basic design. In this case the switched bias, $V_{select}$, is alternately applied to the configuration transistor Q29 to facilitate either the basic or cascoded configuration for the compact amplifier. Detection of single quanta can hence be effected for a broad range of detector capacitance from 5 fF to over 125 fF, depending on the specific amplifier design.

Figure 5:
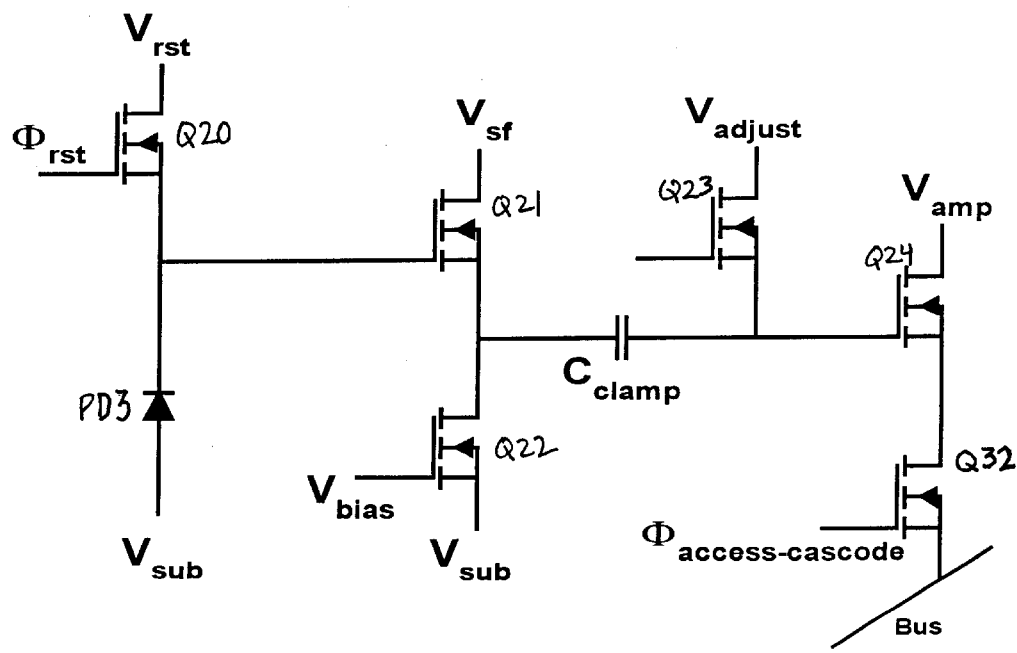
FIG. 5 is a schematic diagram for another alternate embodiment of an ultra-low noise, high gain, high-bandwidth pixel amplifier, suitable for single-photon readout of various photodetectors having detector capacitance in the range from around 25 up to several hundred femtofarads.

FIG. 5 shows a third alternate embodiment that is extensible to pixel pitch significantly less than 10 $\mu$m using 0.25 $\mu$m CMOS process technology. For this embodiment the compact amplifier is distributed amongst the pixel and an external support circuit; the amplifier FET and dual-purpose (pixel access and cascode) FET Q32 are located in the pixel while the current source supplying this amplifier's bias current is located, for example, in the circuitry that supports each column or row of pixels in an imaging array. Because more semiconductor area is available at the end of the column or row, the current source is readily adjustable via various means and the circuitry at each pixel can fit into an even smaller area.

Figure 6:
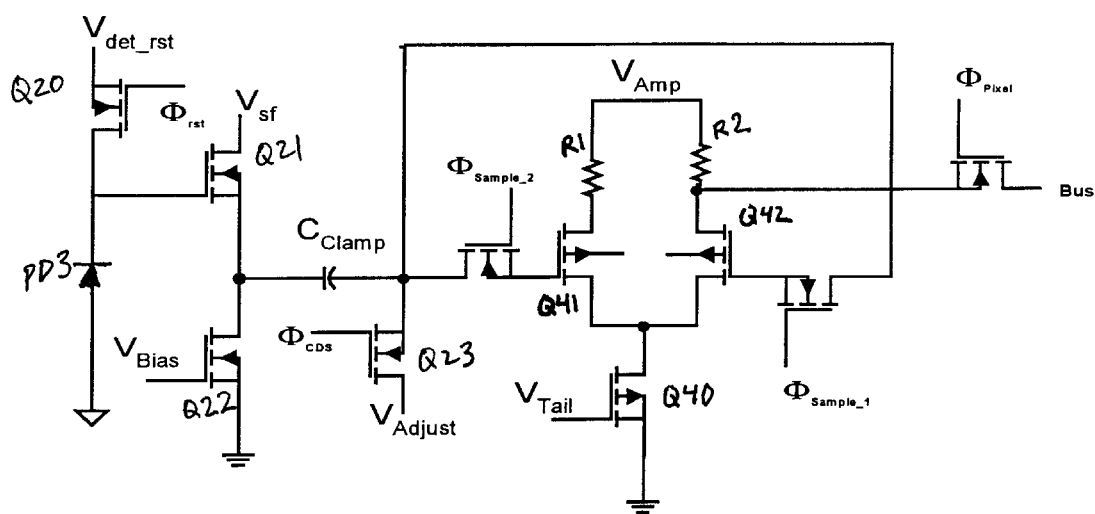
FIG. 6 is a schematic diagram for yet another embodiment of an ultra-low noise, high gain, high-bandwidth pixel amplifier, suitable for single-photon readout of various photodetectors having detector capacitance in the range from about 5 up to several hundred femtofarads.

Low-noise level shifting also enables the use of a differential amplifier in place of the inverter as in FIG. 6. The alternative differential amplifier consists of tail transistor Q40, amplifier transistors Q41 and Q42, and load resistors R1 and R2. Depending on the necessary gain, those skilled in the art can also appreciate that the load resistors can alternately be transistors.

This fourth alternate embodiment can be operated in at least two modes to produce either a noninverted or inverted video signal. In either mode the offset voltage stored on $C_{clamp}$ is sampled onto both the inverting and noninverting inputs of the differential amplifier by enabling both $\Phi_{sample\_1}$ and $\Phi_{sample\_2}$. When the photosignal plus offset is read at the end of the integration time, either $\Phi_{sample\_1}$ or $\Phi_{sample\_2}$, is enabled to effect inverted or noninverted readout, respectively.

The alternate embodiment of FIG. 6 is also capable of snapshot image formation by synchronously applying the various clocking operations across the imaging array including $\Phi_{rst}$, $\Phi_{CDS}$, $\Phi_{sample\_1}$, and $\Phi_{sample\_2}$. Only the process of reading out the integrated signal by separately enabling the various $\Phi_{access}$ clocks occurs at different times across the imaging array.

Applying negative feedback in the appropriate manner can externally set the closed-loop gain of the differential amplifier.

The ultra-low noise amplifiers of this invention provide a total transimpedance that can be expressed as:

$$Z_{T,Amp} = \frac{t_{int}}{C_{det} + C_{input}} \cdot A_v$$

where $t_{int}$ is the integration time, $C_{det}$ is the detector capacitance, $C_{input}$ is the combined capacitance of the source follower transistor and any other capacitances at this node, both stray and intentional, and $A_V$, is the gain of the compact amplifier. The compact amplifier's gain thus mitigates the deleterious reductions in transimpedance resulting from either short integration time or large capacitance.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A single-photon readout circuit, comprising:
   a photodetector that integrates a small-signal photocharge on the detector capacitance in response to incident photons, producing a photodetector output signal;
   a buffer amplifier, arranged to receive said photodetector output signal and to produce a buffered photodetector output signal;
   a signal amplifier having a signal input and producing a signal output;
   a coupling capacitor, having a first terminal connected to said buffered output signal and a second terminal connected to said signal input of said signal amplifier, to shift signal level by an offset voltage; and
   an electronic offset reset switch, connected to said coupling capacitor, for resetting said offset voltage.

2. The photodetector readout circuit of claim 1, wherein said electronic switch comprises a field effect transistor.

3. The photodetector readout circuit of claim 2, wherein said photodetector comprises a photodiode, and further comprising a photodiode reset switch having an open and a closed position;
   said photodiode reset switch connected to discharge said photodiode in said closed position, and to allow charge accumulation when in said open position;
   and wherein said photodiode reset switch is times to open at substantially the same time as said offset reset switch.

4. The photodetector readout circuit of claim 1, wherein said buffer amplifier comprises a field effect transistor (FET) in a source follower configuration, and wherein said signal amplifier comprises a second FET in a common source configuration, thereby producing an inverted signal output.

5. The photodetector readout circuit of claim 4, further comprising a level adjustment voltage connected in series between said offset reset switch and ground, for setting an input level of said signal amplifier.

6. The photodetector readout circuit of claim 5, wherein said signal amplifier comprises at least two FETs connected in a cascade configuration.

7. The photodetector readout circuit of claim 1, wherein said signal amplifier comprises:
   at least two amplifier submodules connected in parallel, a first submodule comprising a common source amplifier, and a second submodule comprising at least two FETs in a cascade configuration; and
   a switch for selectively enabling either of said submodules.

8. The photodetector readout circuit of claim 1, wherein said signal amplifier comprises:
   a differential amplifier having first and second differential inputs, a first differential input arranged to receive a signal from said second terminal of said clamping capacitor; and
   a switch for selectively coupling signal input either to said first or said second differential input.

* * * * *